(12) United States Patent
Weigold (10) Patent No.: US 7,885,423 B2
(45) Date of Patent: Feb. 8, 2011

(54) SUPPORT APPARATUS FOR MICROPHONE DIAPHRAGM

(75) Inventor: Jason W. Weigold, Somerville, MA (US)

(73) Assignee: Analog Devices, Inc., Norwood, MA (US)

( * ) Notice: Subject to any disclaimer, the term of this patent is extended or adjusted under 35 U.S.C. 154(b) by 1047 days.

(21) Appl. No.: 11/625,553

(22) Filed: Jan. 22, 2007

(65) Prior Publication Data

US 2007/0165888 A1    Jul. 19, 2007

Related U.S. Application Data

(63) Continuation-in-part of application No. 11/113,925, filed on Apr. 25, 2005, now Pat. No. 7,825,484.

(60) Provisional application No. 60/760,854, filed on Jan. 20, 2006.

(51) Int. Cl.
*H04R 25/00* (2006.01)

(52) U.S. Cl. .................................. 381/174; 381/175

(58) Field of Classification Search .............. 381/174, 381/173, 175, 190, 191; 307/400; 310/322; 367/140, 170, 181
See application file for complete search history.

(56) References Cited

U.S. PATENT DOCUMENTS

| | | | |
|---|---|---|---|
| 4,492,825 A | 1/1985 | Brzezinski et al. | 179/111 |
| 4,524,247 A | 6/1985 | Lindenberger et al. | 179/111 |
| 4,533,795 A | 8/1985 | Baumhauer, Jr. et al. | 179/111 |
| 4,558,184 A | 12/1985 | Busch-Vishniac et al. | 179/111 |
| 4,744,863 A | 5/1988 | Guckel et al. | 156/653 |
| 4,776,019 A | 10/1988 | Miyatake | 381/174 |
| 4,825,335 A | 4/1989 | Wilner | 361/283 |
| 4,853,669 A | 8/1989 | Guckel et al. | 338/4 |
| 4,996,082 A | 2/1991 | Guckel et al. | 427/99 |
| 5,090,254 A | 2/1992 | Guckel et al. | 73/862.59 |
| 5,113,466 A | 5/1992 | Acarlar et al. | 385/88 |
| 5,146,435 A | 9/1992 | Bernstein | 367/181 |
| 5,178,015 A | 1/1993 | Loeppert et al. | 73/718 |
| 5,188,983 A | 2/1993 | Guckel et al. | 437/209 |
| 5,258,097 A | 11/1993 | Mastrangelo | 156/644 |

(Continued)

FOREIGN PATENT DOCUMENTS

DE    196 48 424    6/1998

(Continued)

OTHER PUBLICATIONS

*Microphone industry to expand MEMS-based offerings*, The Information Network, online <www.theinformationnet.com>, printed Feb. 1, 2005, Nov. 14, 2003, 2 pages.

(Continued)

*Primary Examiner*—Brian Ensey
(74) *Attorney, Agent, or Firm*—Sunstein Kann Murphy & Timbers LLP (57) ABSTRACT

A microphone includes a diaphragm assembly supported by a substrate. The diaphragm assembly includes at least one carrier, a diaphragm, and at least one spring coupling the diaphragm to the at least one carrier such that the diaphragm is spaced from the at least one carrier. An insulator (or separate insulators) between the substrate and the at least one carrier electrically isolates the diaphragm and the substrate.

19 Claims, 8 Drawing Sheets

U.S. PATENT DOCUMENTS

| | | | |
|---|---|---|---|
| 5,303,210 A | 4/1994 | Bernstein | 367/181 |
| 5,314,572 A | 5/1994 | Core et al. | 156/643 |
| 5,317,107 A | 5/1994 | Osorio | 174/52.4 |
| 5,452,268 A | 9/1995 | Bernstein | 367/181 |
| 5,490,220 A | 2/1996 | Loeppert | 381/168 |
| 5,593,926 A | 1/1997 | Fujihira | 437/209 |
| 5,596,222 A | 1/1997 | Bernstein | 257/620 |
| 5,632,854 A | 5/1997 | Mirza et al. | 438/53 |
| 5,633,552 A | 5/1997 | Lee et al. | 310/311 |
| 5,658,710 A | 8/1997 | Neukermans | 430/320 |
| 5,684,324 A | 11/1997 | Bernstein | 257/415 |
| 5,692,060 A | 11/1997 | Wickstrom | 381/169 |
| 5,740,261 A | 4/1998 | Loeppert et al. | 381/168 |
| 5,870,482 A | 2/1999 | Loeppert et al. | 381/174 |
| 5,923,995 A | 7/1999 | Kao et al. | 438/460 |
| 5,939,633 A | 8/1999 | Judy | 73/514.32 |
| 5,956,292 A | 9/1999 | Bernstein | 367/140 |
| 5,960,093 A | 9/1999 | Miller | 381/324 |
| 6,128,961 A | 10/2000 | Haronian | 73/774 |
| 6,140,689 A | 10/2000 | Scheiter et al. | 257/414 |
| 6,243,474 B1 | 6/2001 | Tai et al. | 381/174 |
| 6,249,075 B1 | 6/2001 | Bishop et al. | 310/338 |
| 6,324,907 B1 | 12/2001 | Halteren et al. | 73/431 |
| 6,426,239 B1 | 7/2002 | Gogoi et al. | 438/53 |
| 6,505,511 B1 | 1/2003 | Geen et al. | 73/504.12 |
| 6,522,762 B1 | 2/2003 | Mullenborn et al. | 381/174 |
| 6,535,460 B2 | 3/2003 | Loeppert et al. | 367/181 |
| 6,535,663 B1 | 3/2003 | Chertkow | 385/18 |
| 6,552,469 B1 | 4/2003 | Pederson et al. | 310/309 |
| 6,667,189 B1 | 12/2003 | Wang et al. | 438/53 |
| 6,677,176 B2 | 1/2004 | Wong et al. | 438/50 |
| 6,704,427 B2 | 3/2004 | Kearey | 381/355 |
| 6,732,588 B1 | 5/2004 | Mullenborn et al. | 73/715 |
| 6,741,709 B2 | 5/2004 | Kay et al. | 381/174 |
| 6,753,583 B2 | 6/2004 | Stoffel et al. | 257/416 |
| 6,781,231 B2 | 8/2004 | Minervini | 257/704 |
| 6,812,620 B2 | 11/2004 | Scheeper et al. | 310/324 |
| 6,816,301 B1 | 11/2004 | Schiller | 359/290 |
| 6,829,131 B1 | 12/2004 | Loeb et al. | 361/234 |
| 6,847,090 B2 | 1/2005 | Loeppert | 257/418 |
| 6,857,312 B2 | 2/2005 | Choe et al. | 73/170.13 |
| 6,859,542 B2 | 2/2005 | Johannsen et al. | 381/174 |
| 6,883,903 B2 | 4/2005 | Truninger et al. | 347/71 |
| 6,912,759 B2 | 7/2005 | Izadnegahdar et al. | 29/25.35 |
| 6,914,992 B1 | 7/2005 | van Halteren et al. | 381/113 |
| 7,138,694 B2 | 11/2006 | Nunan et al. | 257/419 |
| 7,142,682 B2 | 11/2006 | Müllenborn et al. | 381/322 |
| 7,146,016 B2 * | 12/2006 | Pedersen | 381/174 |
| 7,148,077 B2 | 12/2006 | Fuertsch et al. | 438/53 |
| 7,166,910 B2 | 1/2007 | Minervini | 257/704 |
| 2002/0079550 A1 | 6/2002 | Daneman et al. | 257/459 |
| 2002/0102004 A1 | 8/2002 | Minervini | 381/175 |
| 2002/0181725 A1 | 12/2002 | Johannsen et al. | 381/174 |
| 2003/0016839 A1 | 1/2003 | Loeppert et al. | 381/174 |
| 2003/0133588 A1 | 7/2003 | Pedersen | 381/423 |
| 2004/0046245 A1 | 3/2004 | Minervini | 257/704 |
| 2004/0179705 A1 | 9/2004 | Wang et al. | 381/175 |
| 2004/0184632 A1 | 9/2004 | Minervini | 381/355 |
| 2004/0184633 A1 | 9/2004 | Kay et al. | 381/355 |
| 2005/0005421 A1 | 1/2005 | Wang et al. | 29/594 |
| 2005/0018864 A1 | 1/2005 | Minervini | 381/175 |
| 2005/0089188 A1 | 4/2005 | Feng | 381/396 |
| 2005/0098840 A1 | 5/2005 | Fuertsch et al. | 257/414 |
| 2005/0102721 A1 | 5/2005 | Barth | 977/DIG. 1 |
| 2005/0185812 A1 | 8/2005 | Minervini | 381/355 |
| 2006/0093170 A1 | 5/2006 | Zhe et al. | 381/191 |
| 2006/0093171 A1 | 5/2006 | Zhe et al. | 381/191 |
| 2006/0116180 A1 | 6/2006 | Minervini | 455/575.1 |
| 2006/0157841 A1 | 7/2006 | Minervini | 257/680 |
| 2006/0280319 A1 | 12/2006 | Wang et al. | 381/172 |
| 2007/0047744 A1 | 3/2007 | Harney et al. | 381/113 |
| 2007/0057602 A1 | 3/2007 | Song | 310/328 |
| 2007/0058826 A1 | 3/2007 | Sawamoto et al. | 381/174 |

FOREIGN PATENT DOCUMENTS

| | | |
|---|---|---|
| DE | 10 2004 011 148 B3 | 11/2005 |
| EP | 0596456 B1 | 5/1994 |
| EP | 0 783 107 A1 | 7/1997 |
| JP | 08240609 | 9/1996 |
| JP | 2005-331281 | 12/2005 |
| WO | WO 83/01362 | 4/1983 |
| WO | WO 01/20948 | 3/2001 |
| WO | WO 01/41497 | 6/2001 |
| WO | WO 02/15636 A2 | 2/2002 |
| WO | WO 02/45463 | 6/2002 |
| WO | WO 02/052893 A1 | 7/2002 |
| WO | WO 2005/036698 | 4/2005 |
| WO | WO 2005/086532 A2 | 9/2005 |
| WO | WO 2005/086532 A3 | 9/2005 |
| WO | WO 2005/111555 A1 | 11/2005 |
| WO | WO 2006/116017 | 11/2006 |
| WO | WO 2007/010361 A2 | 1/2007 |
| WO | WO 2007/010361 A3 | 1/2007 |
| WO | WO 2007/029878 A1 | 3/2007 |

OTHER PUBLICATIONS

*Phone-Or/Technology*, online <file://C:\Documents%20and%20Settings\bmansfield\Local%20Settings\Temporary%20-Internet%20Files\OLKE\Phone-Or%20%...>, printed Feb. 1, 2005, 2 pages.

*Liquid Crystal Polymer (LCP) Air Cavity Packages*, Quantum Leap Packaging, Inc., Brochure, 2004, 2 pages.

Bajdechi et al., *Single-Chip Low-Voltage Analog-to-Digital Interface for Encapsulation with Electret Microphone*, The 11th International Conference on Solid-State Sensors and Actuators, Jun. 10-14, 2001, 4 pages.

Bernstein, *MEMS Air Acoustics Research The Charles Stark Draper Laboratory*, PowerPoint Presentation, Aug. 1999, 8 pages.

Bernstein et al., *High Sensitivity MEMS Ultrasound Arrays by Lateral Ferroelectric Polarization*, Solid-State Sensor and Actuator Workshop, Jun. 4-8, 2000, 4 pages.

Chen et al., *Single-Chip Condenser Miniature Microphone with a High Sensitive Circular Corrugated Diaphragm*, IEEE, 2002, 4 pages.

Cunningham et al., *Wide bandwidth silicon nitride membrane microphones*, SPIE vol. 3223, Sep. 1997, 9 pages.

Fan et al., *Development of Artificial Lateral-Line Flow Sensors*, Solid-State Sensor, Actuator and Microsystems Workshop, Jun. 2-6, 2002, 4 pages.

Fuldner et al., *Silicon Microphones with Low Stress Membranes*, The 11th International Conference on Solid-State Sensors and Actuators, Jun. 10-14, 2001, 4 pages.

Gale et al., *MEMS Packaging*, University of Utah, Microsystems Principles, PowerPoint Presentation, Oct. 11, 2001, 8 pages.

Hall et al., *Self-Calibrating Micromachined Microphones with Integrated Optical Displacement Detection*, The 11th International Conference on Solid State Sensors and Actuators, Jun. 10-14, 2001, 4 pages.

Harper (Editor-in-Chief), *Electronic Packaging and Interconnection Handbook*, Third Edition, McGraw-Hill, Chapter 7, Section 7.2.3.1, 2000, 5 pages.

Hsieh et al., *A Micromachined Thin-film Teflon Electret Microphone*, Department of Electrical Engineering California Institute of Technology, 1997, 4 pages.

Kabir et al., *High Sensitivity Acoustic Transducers with Thin P+ Membranes and Gold Back-Plate*, Sensors and Actuators, vol. 78, Issue 2-3, Dec. 17, 1999, 17 pages.

Ko et al., *Piezoelectric Membrane Acoustic Devices*, IEEE, 2002, 4 pages.

Kopola et al., *MEMS Sensor Packaging Using LTCC Substrate Technology*, VTT Electronics, Proceedings of SPIE vol. 4592, 2001, pp. 148-158.

Lemkin, M., et al., *A 3-Axis Force Balanced Accelerometer Using a Single Proof-Mass*, Transducers 97, IEEE, Jun. 16-19, 1997.

M. Brauer et al., *Increasing the Performance of Silicon Microphones by the Benefit of a Complete System Simulation*, IEEE, pp. 528-531, 2004.

M. Brauer et al., *Silicon Microphone Based on Surface and Bulk Micromachining*, Journal of Micromechanics and Microengineering, 11 (2001), pp. 319-322.

Ma et al., *Design and Fabrication of an Integrated Programmable Floating-Gate Microphone*, IEEE, 2002, 4 pages.

Mason, Jack, *Companies Compete To Be Heard On the Increasingly Noisy MEMS Phone Market*, Small Times: News about MEMS, Nanotechnology and Microsystems, Jul. 18, 2003, 4 pages.

Maxim Integrated Products, *Electret Condenser Microphone Cartridge Preamplifier*, Maxim Integrated Products, Jul. 2002, 9 pages.

Neumann, Jr. et al., *A Fully-Integrated CMOS-MEMS Audio Microphone*, The 12$^{th}$ International Conference on Solid State Sensors, Actuators and Microsystems Jun. 8-12, 2003, 4 pages.

Ono et al., *Design and Experiments of Bio-mimicry Sound Source Localization Sensor with Gimbal-Supported Circular Diaphragm*, The 12$^{th}$ International Conference on Solid State Sensors, Actuators and Microsystems, Jun. 8-12, 2003, 4 pages.

Pedersen et al., *A Polymer Condenser Microphone on Silicon with On-Chip CMOS Amplifier*, Solid State Sensors and Actuators, 1997, 3 pages.

Prismark Partners LLC, *The Prismark Wireless Technology Report*, Prismark Partners LLC, Mar. 2005, 27 pages.

Rugg et al., *Thermal Package Enhancement Improves Hard Disk Drive Data Transfer Performance*, 6 pages.

S. Bouwstra et al., *Silicon Microphones—A Danish Perspective*, Journal of Micromechanics and Microengineering, 8 (1998) pp. 64-68.

Schafer et al., *Micromachined Condenser Microphone for Hearing Aid Use*, Solid-State Sensor and Actuator Workshop, Jun. 8-11, 1998, 4 pages.

Scheeper et al., *A review of silicon microphones*, Sensors and Actuators A, ol. a44, No. 1, Jul. 1994, pp. 1-11.

Sheplak et al., *A Wafer-Bonded, Silicon-Nitride Membrane Microphone with Dielectrically-Isolated, Single-Crystal Silicon Piezoresistors*, Solid-State Sensor and Actuator Workshop, Jun. 8-11, 1998, 4 pages.

Stahl, et al., Thin Film Encapsulation of Acceleration Sensors Using Polysilicon Sacrificial Layer, Transducers '03, *The 12$^{th}$ International Conference on Solid State Sensors, Actuators and Microsystems*, Jun. 8-12, 2003, 4 pages.

Weigold et al., *A MEMS Condenser Microphone for Consumer Applications*, Analog Devices, Inc. and Pixtronix, Inc., Jan. 2006, 3 pages.

Yovcheva et al., *Investigation on Surface Potential Decay in PP Corona Electrets*, BPU-5: Fifth General Conference of the Balkan Physical Union, Aug. 25-29, 2003, 4 pages.

Zou et al., *A Novel Integrated Silicon Capacitive Microphone—Floating Electrode "Electret" Microphone (FEEM)*, Journal of Microelectromechanical Systems, vol. 7, No. 2, Jun. 1998, 11 pages.

Authorized Officer—Isabelle Brant, *The International Search Report and the Written Opinion of the International Searching Authority*, International Application No. PCT/US2007/060852, International Searching Authority, Jan. 22, 2007, 192 pages.

Authorized Officer Paolo Polesello, The International Search Report and Written Opinion of the International Searching Authority, Int'l Application No. PCT/US2006/048788, dated Aug. 20, 2007, 14 pages.

Gilleo, Ken, MEMS and MOEMS Packaging, Jul. 11, 2005, McGraw-Hill, XP002420065, pp. 84, 96-97.

Authorized Officer Dana Schalinatus, Invitation to Pay Additional Fees, International Searching Authority, Int'l Application No. PCT/US2006/014982, Sep. 4, 2006, 5 pages.

Authorized Officer Stephan Gerken, International Search Report and Written Opinion of the International Searching Authority, Int'l Application No. PCT/US2006/014982, Nov. 13, 2006, 13 pages.

Authorized Officer Philippe Foussier, International Search Report and Written Opinion of the International Searching Authority, PCT/US2006/031958, Feb. 27, 2007, 8 pages.

European Patent Office:, Communication Pursuant to Article 94(3) EPC; Application No. 06 849 089.5-1528; Feb. 19, 2009, 3 pages.

European Patent Office: Authorized Officer Nora Lindner, International Preliminary Report on Patentability; PCT/US2005/048788; Jul. 1, 2008, 7 pages.

European Patent Office:, Communication Pursuant to Article 94(3)—EPC dated Feb. 24, 2010—Application No. 06 750 896.0-2225.

Hoffmann Eitle, Response to Official Action dated Feb. 19, 2009—European Patent Application No. 06 849 089.5.

Hoffmann Eitle, Response to Official Action dated Feb. 24, 2010—Application No. 06 750 896.0-2225.

Kim & Chang, Translation of Notice of Preliminary Rejection in Korean patent application 10-2008-7018667 dated May 26, 2010, 2 pages.

\* cited by examiner

SUPPORT APPARATUS FOR MICROPHONE DIAPHRAGM

CROSS-REFERENCE TO RELATED APPLICATIONS

This application is a continuation-in-part of U.S. patent application Ser. No. 11/113,925 entitled MICROMACHINED MICROPHONE AND MULTISENSOR AND METHOD FOR PRODUCING SAME filed on Apr. 25, 2005 in the names of John R. Martin, Timothy J. Brosnihan, Craig Core, Thomas Kieran Nunan, Jason Weigold, Xin Zhang. This application also claims priority from U.S. Provisional Patent Application No. 60/760,854 entitled SUPPORT APPARATUS FOR MICROPHONE DIAPHRAGM filed on Jan. 20, 2006 in the names of Timothy J. Brosnihan, Xin Zhang, Craig Core, and Jason W. Weigold. The subject matter of U.S. patent application Ser. No. 11/366,941 entitled PACKAGED MICROPHONE WITH ELECTRICALLY COUPLED LID filed on Mar. 2, 2006 in the names of Kieran Harney, John R. Martin, and Lawrence Felton, which claims priority from U.S. Provisional Patent Application No. 60/708,449 entitled MICROPHONE WITH PREMOLDED TYPE PACKAGE filed on Aug. 16, 2005 in the names of Lawrence Felton, Kieran Harney, and John Martin, may also be relevant to this application. The above-referenced patent applications are hereby incorporated herein by reference in their entireties.

This patent application may also be related to one or more of the following listed United States patent applications, which are owned by Analog Devices, Inc. of Norwood, Mass., all of which are hereby incorporated herein by reference in their entireties:

METHOD OF FORMING A MEMS DEVICE, naming Thomas Kieran Nunan and Timothy J. Brosnihan, filed Jan. 3, 2005, and having Ser. No. 11/028,249.

MICROPHONE WITH IRREGULAR DIAPHRAGM, naming Jason Weigold as inventor, filed Aug. 23, 2005, and having Ser. No. 60/710,517, MULTI-MICROPHONE SYSTEM, naming Jason Weigold and Kieran Harney as inventors, filed Aug. 23, 2005, and having Ser. No. 60/710,624, MICROPHONE SYSTEM, naming Kieran Harney as inventor, filed Aug. 23, 2005, and having Ser. No. 60/710,515, PARTIALLY ETCHED LEADFRAME PACKAGES HAVING DIFFERENT TOP AND BOTTOM TOPOLOGIES, naming Kieran Harney, John R. Martin, Lawrence Felton, filed Jan. 24, 2006, and having Ser. No. 11/338,439.

MICROPHONE WITH ENLARGED BACK-VOLUME, naming Kieran Harney as inventor, filed Nov. 28, 2005, and having Ser. No. 60/740,169.

MICROPHONE WITH PRESSURE RELIEF, naming Xin Zhang, Michael W. Judy, Kieran P. Harney, Jason W. Weigold, filed Jan. 17, 2007, and having Ser. No. 60/885,314.

FIELD OF THE INVENTION

The invention generally relates to microphones and, more particularly, the invention relates to support for microphone diaphragms.

BACKGROUND OF THE INVENTION

Microelectromechanical systems ("MEMS," hereinafter "MEMS devices") are used in a wide variety of applications. For example, MEMS devices currently are implemented as microphones to convert audible signals to electrical signals, as gyroscopes to detect pitch angles of airplanes, and as accelerometers to selectively deploy air bags in automobiles. In simplified terms, such MEMS devices typically have a movable structure suspended from a substrate, and associated circuitry that both senses movement of the suspended structure and delivers the sensed movement data to one or more external devices (e.g., an external computer). The external device processes the sensed data to calculate the property being measured (e.g., pitch angle or acceleration).

MEMS microphones are being increasingly used in a greater number of applications. For example, MEMS microphones are often used in cellular phones and other such devices. To penetrate more markets, however, it is important to obtain satisfactory sensitivity and signal to noise ratios that match more traditional microphones.

MEMS microphones typically include a thin diaphragm electrode and a fixed sensing electrode that is positioned alongside the diaphragm electrode. The diaphragm electrode and the fixed sensing electrode act like plates of a variable capacitor. During operation of the microphone, charges are placed on the diaphragm electrode and the fixed sensing electrode. As the diaphragm electrode vibrates in response to sound waves, the change in distance between the diaphragm electrode and the fixed sensing electrode results in capacitance changes that correspond to the sound waves. These changes in capacitance therefore produce an electronic signal that is representative of the sound waves. Eventually, this electronic signal may be processed to reproduce the sound waves, for example, on a speaker.

Figure 1:
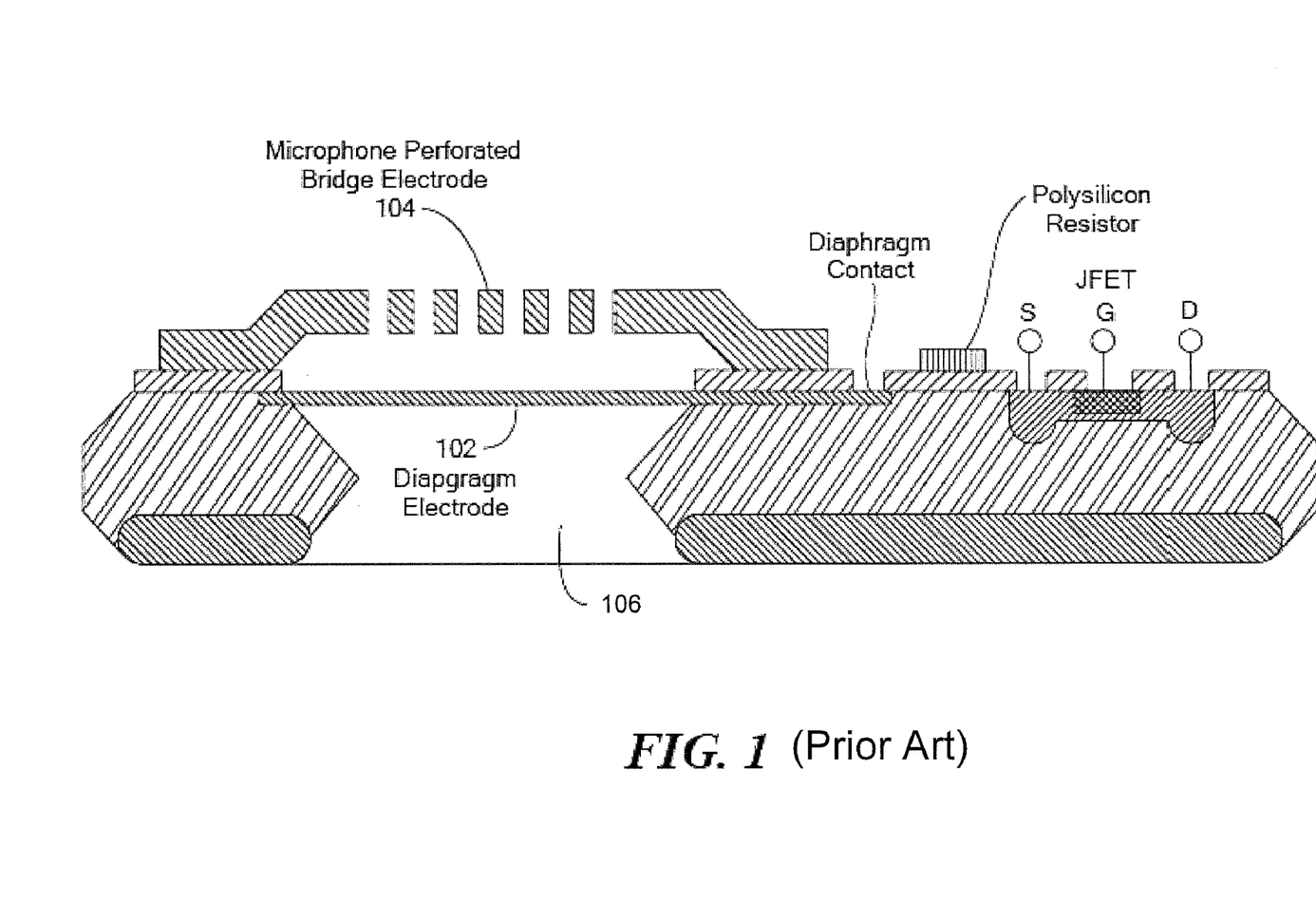
FIG. 1 shows the general structure of a micromachined microphone as known in the art.

FIG. 1 shows the general structure of a micromachined microphone as known in the art. Among other things, the micromachined microphone includes a diaphragm 102 and a bridge electrode (i.e. backplate) 104. The diaphragm 102 and the backplate 104 act as electrodes for a capacitive circuit. As shown, the backplate 104 may be perforated to allow sound waves to reach the diaphragm 102. Alternatively or additionally, sound waves can be made to reach the diaphragm through other channels. In any case, sound waves cause the diaphragm to vibrate, and the vibrations can be sensed as changes in capacitance between the diaphragm 102 and the bridge 104. The micromachined microphone typically includes a substantial cavity 106 behind the diaphragm 102 in order to allow the diaphragm 102 to move freely.

Figure 2A:
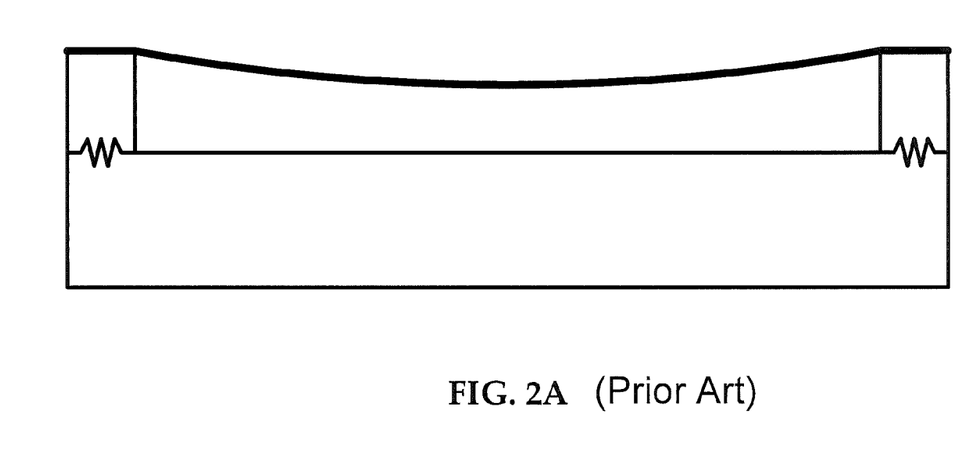
FIG. 2A schematically shows the bowing motion of a drum-like MEMS microphone diaphragm.

Many MEMS microphones use a diaphragm that is anchored completely around its periphery, similar to the head of a drum. Such diaphragms can present a number of problems. For example, in the presence of sound waves, such diaphragms tend to bow rather than move up and down uniformly, as shown in FIG. 2A. Such bowing can negatively affect the sensitivity of the microphone, specifically due to the limited displacement of the diaphragm causes by internal tension and the variation in distance between portions of the diaphragm and the fixed sensing electrode. Also, such diaphragms can suffer from sensitivity to stresses (e.g., heat expansion), which can distort the shape of the diaphragm and can affect the mechanical integrity of the diaphragm as well as the sound quality produced by the microphone.

Figure 2B:
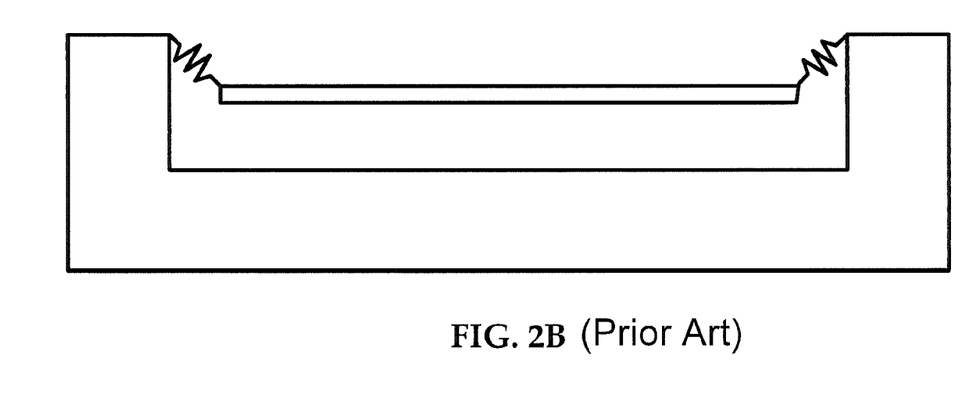
FIG. 2B schematically shows the plunging motion of a spring-attached MEMS microphone diaphragm.

Some MEMS microphones have a diaphragm that is movably connected with its underlying stationary member (referred to hereinafter as a "carrier") by way of a plurality of springs. The springs tend to enable the diaphragm to move up and down uniformly (i.e., like a plunger), as shown in FIG. 2B.

SUMMARY OF THE INVENTION

In accordance with one aspect of the invention there is provided a microphone having a substrate; a diaphragm assembly supported by the substrate, the diaphragm assembly including at least one carrier, a diaphragm, and at least one spring coupling the diaphragm to the at least one carrier, the diaphragm being spaced from the at least one carrier; and at least one insulator between the substrate and the at least one carrier so as to electrically isolate the diaphragm and the substrate.

In various alternative embodiments, the substrate and the diaphragm may be capacitively coupled to form a fixed plate and a movable plate of a variable capacitor. Each carrier may be coupled to an insulator that is coupled to the substrate. The diaphragm may be perforated and/or corrugated. The space between the diaphragm and the at least one carrier may be in a nominal plane of the diaphragm. The diaphragm may be stress isolated from the at least one carrier. The at least one carrier may include a single unitary carrier surrounding the diaphragm or may include a plurality of distinct carriers. The at least one insulator may include an oxide. The diaphragm assembly may include polysilicon. The at least one insulator may be formed directly or indirectly on the substrate, and the at least one carrier may be formed directly or indirectly on the at least one insulator. The substrate may be formed from a silicon layer of a silicon-on-insulator wafer. The substrate may include a number of throughholes, in which case the throughholes may allow sound waves to reach the diaphragm from a back-side of the substrate. The microphone may include electronic circuitry that produces a signal in response to diaphragm movement. The electronic circuitry may be formed direct or indirectly on the substrate.

In accordance with another aspect of the invention there is provided a microphone including a substrate; a diaphragm; support means for movably coupling the diaphragm to the substrate, the support means including carrier means for fixed coupling with the substrate and suspension means for movably coupling the diaphragm to the carrier means and spacing the diaphragm from the carrier means; and insulator means for electrically isolating the diaphragm and the substrate.

In various alternative embodiments, the microphone may further include means for capacitively coupling the substrate and the diaphragm to form a fixed plate and a movable plate of a variable capacitor. The microphone may additionally or alternatively include means for allowing sound waves to reach the diaphragm from a back-side of the substrate. The microphone may additionally or alternatively include means for producing a signal in response to diaphragm movement.

BRIEF DESCRIPTION OF THE DRAWINGS

The foregoing advantages of the invention will be appreciated more fully from the following further description thereof with reference to the accompanying drawings wherein.

In order to facilitate interpretation of black-and-white reproductions of certain figures, various materials are identified using the following legend: "S" indicates single-crystal silicon; "O" indicates oxide; "P" indicates polysilicon; "M" indicates metal; and "Pass" indicates a passivation material such as nitride.

Unless the context otherwise suggests, like elements are indicated by like numerals. Also, unless noted otherwise, the drawings are not necessarily drawn to scale.

DESCRIPTION OF ILLUSTRATIVE EMBODIMENTS

In embodiments of the present invention, a MEMS microphone includes a diaphragm assembly supported by a substrate. The diaphragm assembly includes at least one carrier, a diaphragm, and at least one spring coupling the diaphragm to the at least one carrier such that the diaphragm is spaced from the at least one carrier. An insulator (or separate insulators) between the substrate and the at least one carrier electrically isolates the diaphragm and the substrate. The carrier may be coupled directly to the insulator and the insulator may be coupled directly to the substrate; alternatively, one or more additional materials may separate the insulator from the substrate and/or the carrier. With the diaphragm and the substrate electrically isolated from one another, the diaphragm and the substrate may be capacitively coupled and therefore may be used as the two plates of a variable capacitor in order to convert audible signals to electrical signals.

Figure 3:
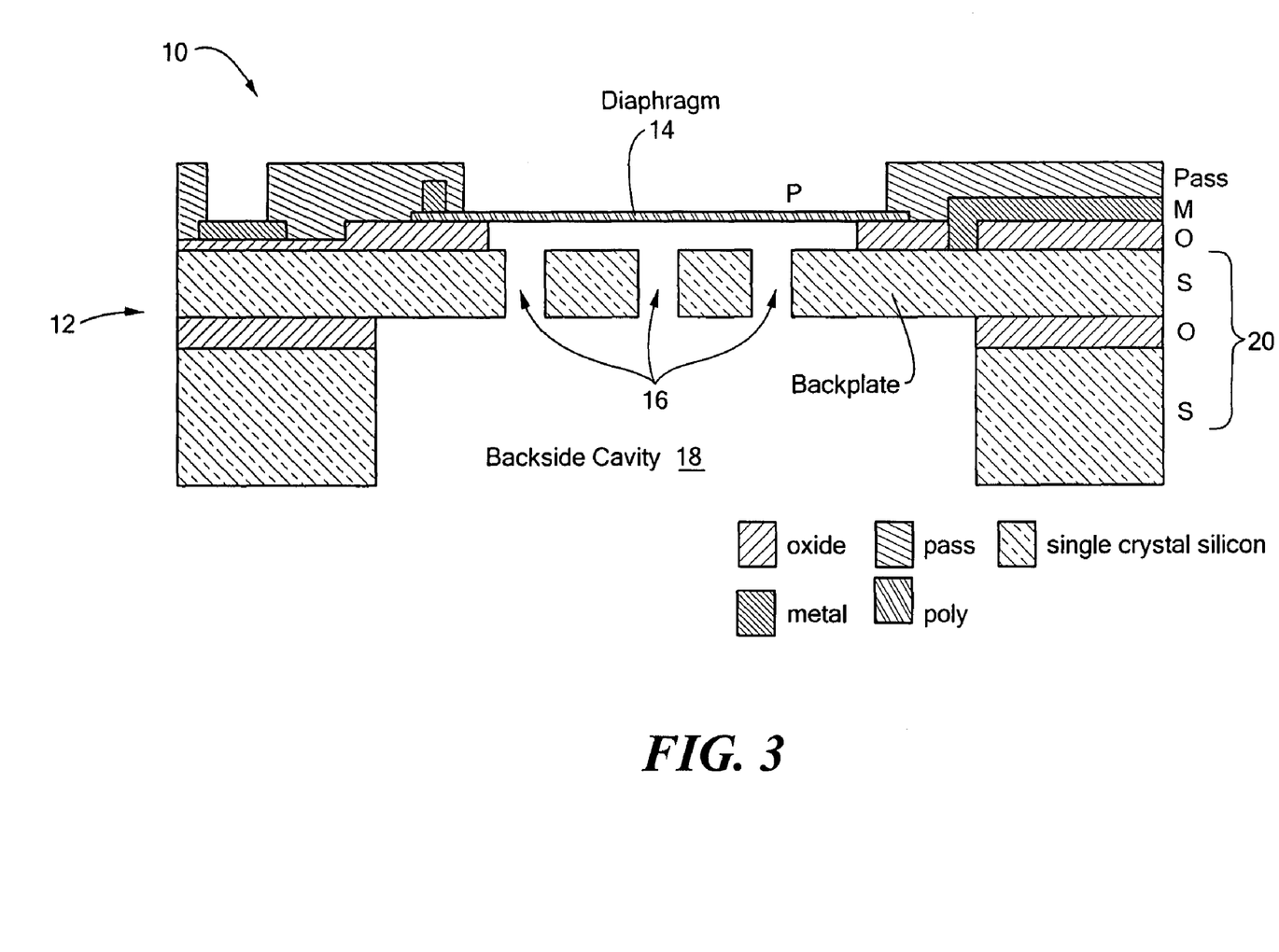
FIG. 3 schematically shows a MEMS microphone that may be produced in accordance with illustrative embodiments of the invention.

FIG. 3 schematically shows an unpackaged MEMS microphone 10 (also referred to as a "microphone chip 10") in accordance with illustrative embodiments of the invention. Among other things, the microphone 10 includes a static backplate 12 that supports and forms a variable capacitor with a diaphragm assembly including diaphragm 14 (details of the connection of the diaphragm assembly and the backplate 12 are discussed below). In illustrative embodiments, the backplate 12 is formed from single crystal silicon, the diaphragm assembly including diaphragm 14 is formed from deposited polysilicon, and the insulator between the backplate 12 and the diaphragm assembly is formed from an oxide. In this example, the backplate 12 is formed from the top silicon layer of a silicon-on-insulator (SOI) wafer 20 and so rests on an underlying oxide layer and a base silicon layer. To facilitate operation, the backplate 12 has a plurality of throughholes 16 that lead to a back-side cavity 18 formed through the underlying oxide layer and the base silicon layer. The microphone 10 may be used or packaged in such a way that sound waves reach the diaphragm 14 through the back-side cavity 18 and throughholes 16.

Audio signals cause the diaphragm 14 to vibrate, thus producing a changing capacitance. On-chip or off-chip circuitry converts this changing capacitance into electrical signals that can be further processed. It should be noted that discussion of the microphone 10 shown in FIG. 3 is for illustrative purposes only. Other MEMS microphones having similar or dissimilar structure to the microphone 10 shown in FIG. 3 therefore may be used with illustrative embodiments of the invention.

Figure 4:
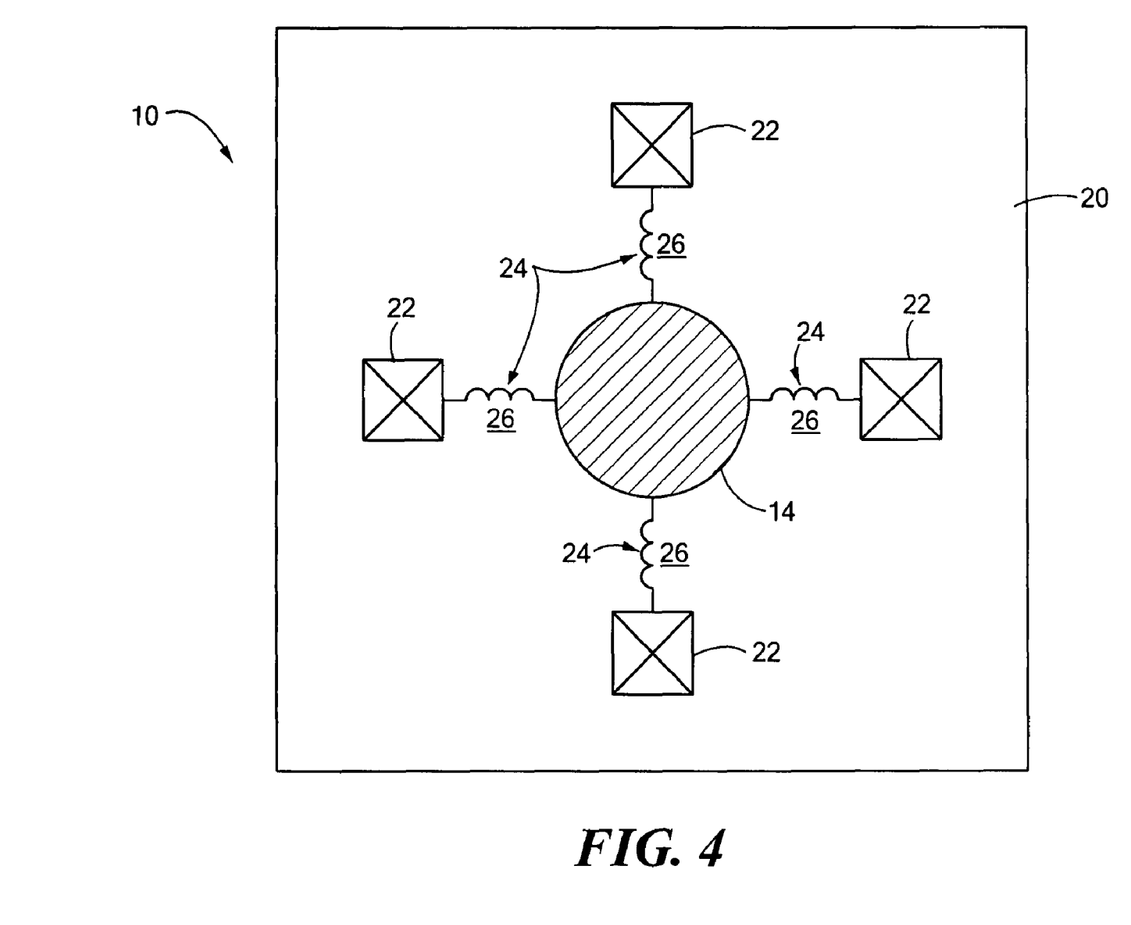
FIG. 4 schematically shows a plan view of the microphone of FIG. 3 configured in accordance with illustrative embodiments of the invention.

FIG. 4 schematically shows a plan view of a microphone 10 configured in accordance with illustrative embodiments. This exemplary microphone 10 has many of the same features as those shown in FIG. 3. Specifically, as shown, the microphone 10 includes a substrate 20 with a plurality of carriers 22 (in this case, four carriers) that support the diaphragm 14 via a plurality of springs 24. Unlike the diaphragm 14, each carrier 22 is fixedly coupled with the substrate 20. In illustrative embodiments, a layer of electrical insulator material (e.g., an oxide) couples each carrier 22 to the substrate 20 and electrically insulates each carrier 22 from the substrate 20.

Among other things, this arrangement forms an expansion space 26 between at least one of the carriers 22 and the diaphragm 14. Therefore, if subjected to stresses, the diaphragm 14 can freely expand into this space 26. Accordingly, under anticipated stresses, the diaphragm 14 should not mechanically contact the carriers 22 (such contact could degrade system performance).

Figure 5:
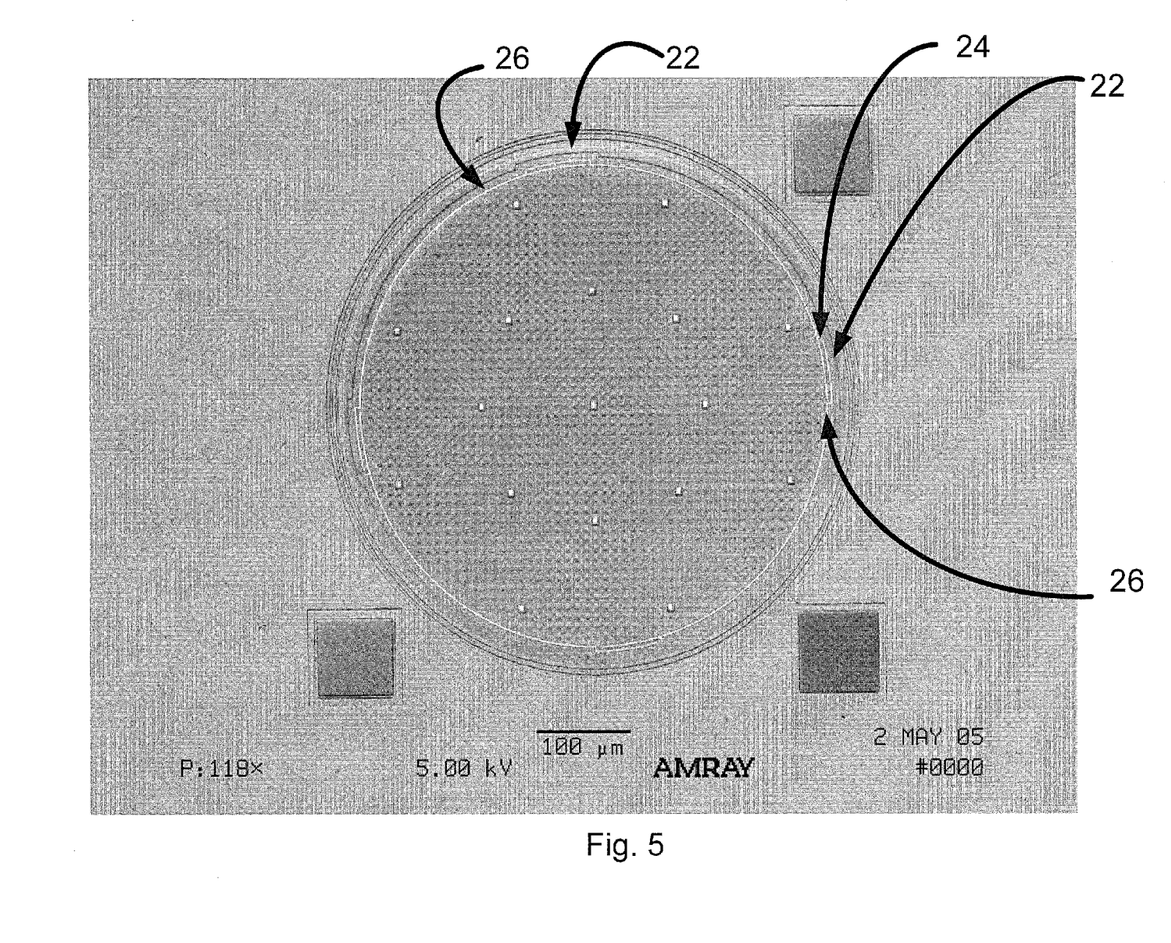
FIG. 5 shows a plan view photograph of a specific microphone configured in accordance with illustrative embodiments.
Figure 6:
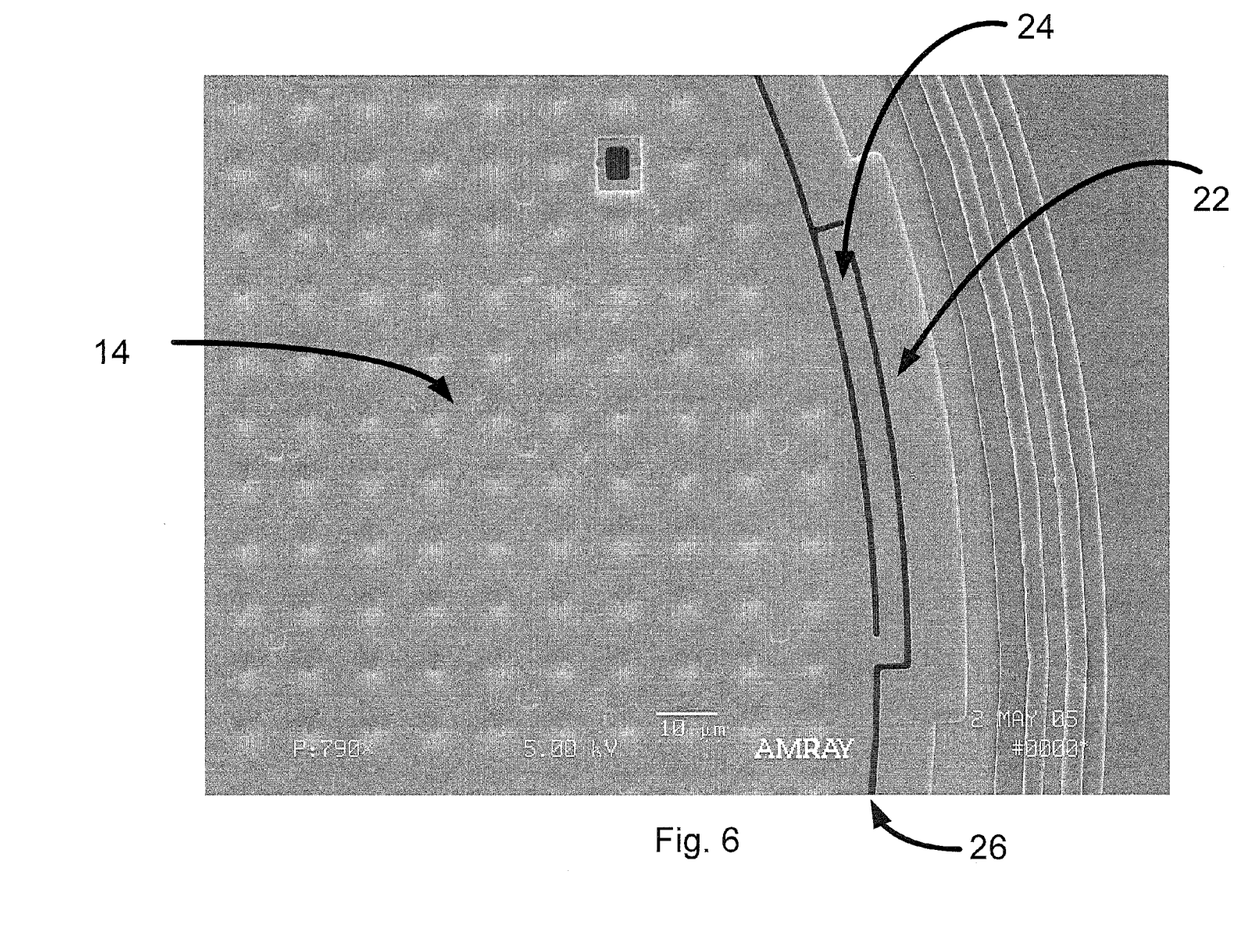
FIG. 6 shows a close-up plan view picture of the spring shown in FIG. 5.

FIG. 5 shows a plan view photograph of a specific microphone 10 configured in accordance with illustrative embodiments, while FIG. 6 shows a close-up plan view picture of one spring 24 shown in FIG. 5. It should be noted that the specific microphones 10 are examples of various embodiments of the invention. Accordingly, discussion of specific components, such as the shape and number of springs 24, should not be construed to limit various embodiments of the invention.

As shown, the microphone 10 has a circular diaphragm 14 and four radially extending but circumferentially shaped springs 24 that form the space 26 between the carrier(s) 22 and the outer peripheral edge of the diaphragm 14. In this example, the diaphragm assembly includes a single unitary carrier 22 surrounding the diaphragm 14. In addition to providing the noted expansion space 26, the springs 24 also should mitigate diaphragm bowing (i.e., when the diaphragm 14 is concave when viewed from its top) when moved downwardly. Accordingly, because of this, the diaphragm 14 should move toward the substrate 20 in a more uniform manner than prior art designs having no space 26 or springs 24. For example, the diaphragm 14 may move upwardly and downwardly in a manner that approximates a plunger. Accordingly, the diaphragm 14 should be able to move up and down more freely, and more area of the inner face of the diaphragm 14 should be usable to produce the underlying signal.

Figure 7:
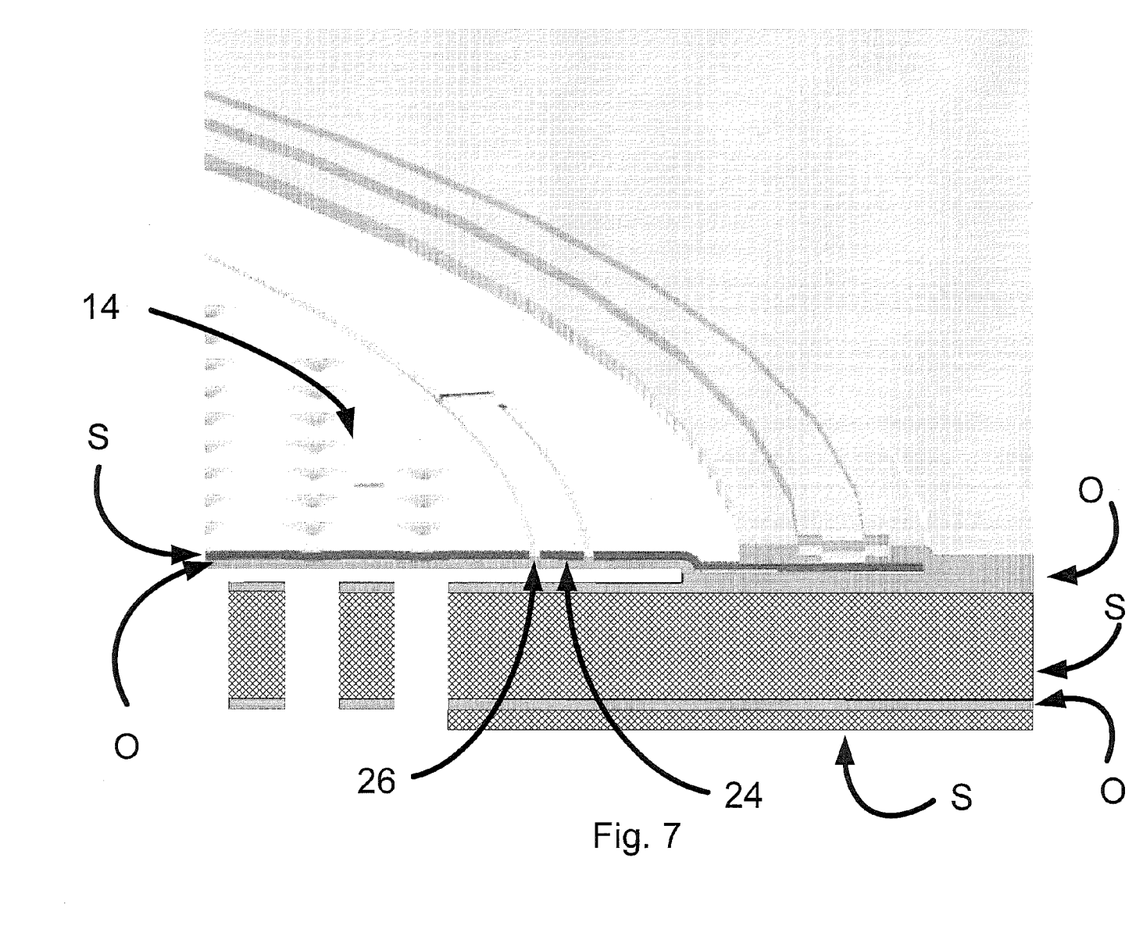
FIG. 7 schematically shows a cross-sectional and partial top view of a microphone configured in accordance with illustrative embodiments of the invention, with the diaphragm in an unreleased state.
Figure 8:
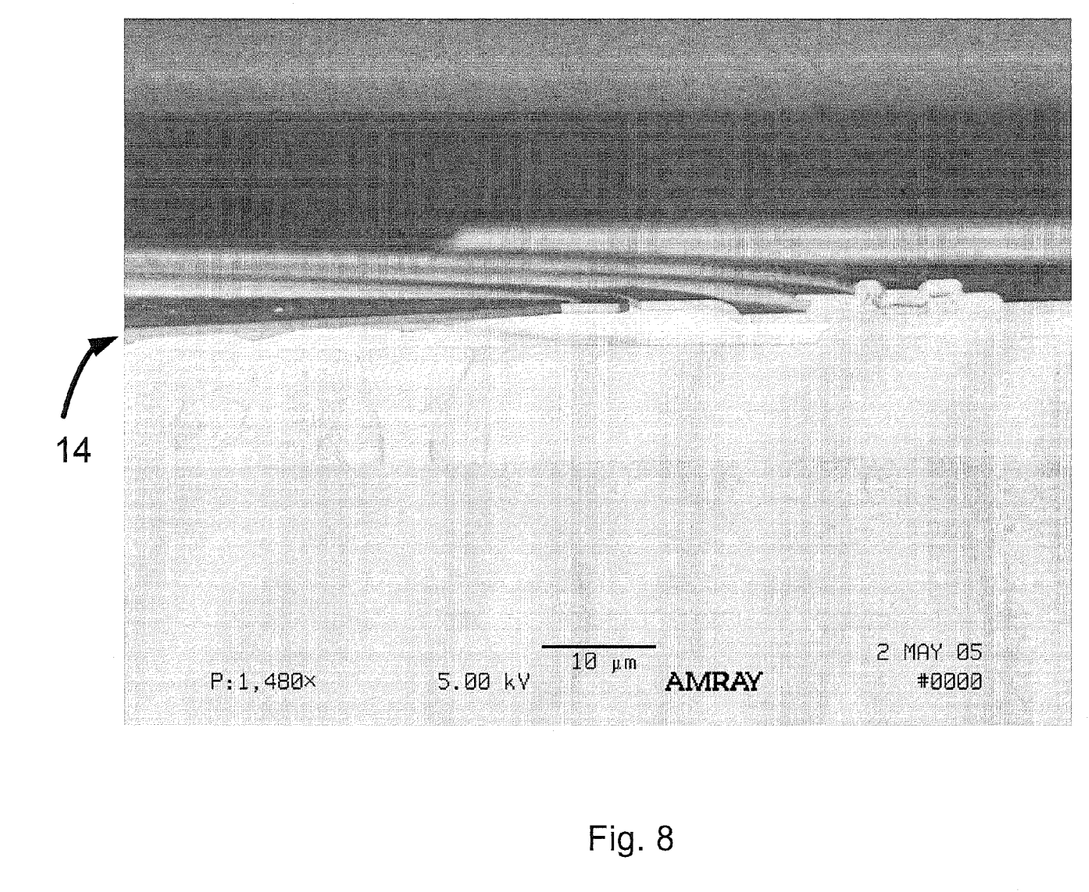
FIG. 8 schematically shows a cross-sectional and partial top view of a microphone configured in accordance with illustrative embodiments of the invention, with the diaphragm in a released state.

FIG. 7 schematically shows a cross-sectional and partial top view of a microphone 10 configured in accordance with illustrative embodiments of the invention, with the diaphragm in an unreleased state. This drawing schematically shows a number of features discussed above, such as the space between the diaphragm 14 and the substrate 20, as well as the space 26 between the diaphragm 14 and the carrier 22. In this figure, the diaphragm is shown with an underlayer of oxide, which is later removed in order to release the diaphragm. FIG. 8 schematically shows a cross-sectional and partial top view of a microphone configured in accordance with illustrative embodiments of the invention, with the diaphragm in a released state (i.e., with the underlayer of oxide removed).

In certain embodiments of the present invention, a micromachined microphone may be formed from a silicon or silicon-on-insulator (SOI) wafer. As known in the art, a SOI wafer includes a top silicon layer, usually called the device layer, an intermediate insulator (oxide) layer, and a bottom silicon layer that is typically much thicker than the top silicon layer (e.g., approximately 650 microns). The top layer formed in either a silicon or a SOI wafer may be relatively thin (e.g., approximately 10 microns thick) in some embodiments of the invention or may be relatively thick (e.g., approximately 50 microns thick) in other embodiments. In certain embodiments of the present invention, the fixed sensing electrode (also referred to herein as a "backplate") may be formed from the top silicon layer of the wafer, and the diaphragm may be formed so as to be suspended above the top silicon layer. Perforations may be formed in the fixed sensing electrode to allow sound waves to reach the diaphragm from the bottom side of the wafer. An insulating layer (e.g., an oxide layer) on the back side of the top silicon layer, which may be the inherent oxide layer of a SOI wafer or an oxide layer deposited on a silicon wafer, may be used as an etch stop layer for controlling the machining of the fixed sensing electrode.

An exemplary process for forming a micromachined microphone from an SOI wafer involves etching trenches through the top silicon layer of a blank SOI wafer into the intermediate oxide layer and optionally through to the bottom silicon layer. The trenches are then lined with an oxide material. A polysilicon material is then deposited so as to fill the lined trenches and cover the top silicon. The polysilicon material is patterned and etched to form various sacrificial structures that will be removed later. Additional oxide material is deposited. A polysilicon material is deposited and patterned to form the diaphragm assembly including the microphone diaphragm and suspension spring. Oxide is deposited, and holes are etched to expose portions of the backplate and the diaphragm assembly. Metal is deposited and patterned in order to form an electrode for placing electrical charge on the diaphragm, an electrode for placing electrical charge on the backplate, and a plurality of bond pads. There may be electrical connections between bond pads and the electrodes. Passivation layers (e.g., an oxide layer covered by a nitride layer, which is a standard passivation layer used for integrated circuitry) are then deposited. The passivation layers are etched to expose the bond pad and to expose the diaphragm. Photoresist material is deposited and then patterned to expose a future pedestal area. The oxide at the future pedestal area is then removed by etching. The remaining photoresist material is removed, and the bottom silicon layer is optionally thinned from approximately 650 microns to approximately 350 microns by any of several methods including etching, grinding and polishing. Photoresist material is deposited on the front side of the wafer so as to form a photoresist pedestal. Photoresist material is also deposited on the back side of the wafer and patterned to outline a backside cavity. The backside cavity is formed by etching away a portion of the bottom silicon layer to the intermediate oxide layer. In an exemplary embodiment, the backside cavity after packaging is approximately one cubic millimeter in volume. A portion of the intermediate oxide layer within the cavity is removed in order to expose the sacrificial polysilicon structures. The sacrificial polysilicon structures are removed, e.g., by exposing the polysilicon to $XeF_2$ gas or another suitable silicon etchant through the backside cavity. It should be noted that the $XeF_2$ gas may remove some of the exposed bottom silicon layer, although this is generally undesirable. The oxide behind the diaphragm is removed, e.g., by placing in an appropriate liquid. Then, the front side photoresist material (including the pedestal) is removed, e.g., in a dry etch (not a liquid). This essentially releases the diaphragm and related structures. It should be noted that the pedestal is used to support the delicate microphone structures during release and may not be required in all embodiments, particularly if vapor HF is used to remove the oxide instead of a liquid.

An exemplary process for forming a micromachined microphone from a regular silicon wafer involves depositing an oxide layer on the silicon wafer. Then, a polysilicon material is patterned and etched to form the diaphragm assembly. An oxide material is deposited, and holes are etched to expose portions of the substrate and the diaphragm assembly. Metal is deposited and patterned in order to form bond pads and electrodes for placing charge on the microphone diaphragm and backplate. There may be electrical connections between the bond pads and one or more of the electrodes. Passivation layers (e.g., an oxide layer covered by a nitride layer, which is a standard passivation layer used for integrated circuitry) are deposited. The passivation layers are etched to expose the bond pads. A portion of the passivation layers above the microphone structures is removed and the oxide over and partially under the polysilicon structures is removed to form resist pedestal areas. The back side of the silicon wafer is optionally thinned from approximately 650 microns to approximately 350 microns by any of several methods including etching, grinding and polishing the back side, and a layer of oxide is deposited on the back side of the wafer. A photoresist material is deposited on the front side of the wafer, and the oxide on the back side of the wafer is patterned. A photoresist material is deposited and patterned on the back side of the wafer, and trenches are etched into the silicon wafer. The photoresist material is removed from both the front side and the back side, and a new layer of photoresist material is deposited on the front side for protection. Cavities are then etched in the back side of the wafer using the existing oxide as a hard mask. The trenches are then further etched through the silicon layer to the resist pedestal areas of the microphone region. The oxide exposed through the cavities is removed, e.g., by exposing to HF gas. The remaining photoresist material is removed from the front side of the wafer, thereby releasing the microphone structures. Finally, borosilicate glass may be aligned and anodic bonded to the back side of the wafer. Microphone holes may be ultrasonically cut in the glass prior to bonding.

It should also be noted that these described processes are exemplary only. For any particular implementation, fewer, additional, or different steps or processes may be utilized. In some cases, materials different than those described may be suitable for a particular step or process. It would be virtually impossible to describe every combination and permutation of materials and processes that could be employed in various embodiments of the invention. Therefore, the present invention is intended to include all such materials and processes including suitable variations of the materials and processes described. Furthermore, micromachined microphones of the types described above may be formed on the same wafer along with an inertial sensor and/or electronic circuitry and may be packaged in a variety of form factors.

It should also be noted that the present invention is not limited to any particular shape, configuration, or composition of microphone diaphragm. The microphone may be, for example, round or square, solid or perforated by one or more holes, and/or flat or corrugated. Different diaphragm configurations might require different or additional processes from those described. For example, additional processes may be used to form holes or corrugations in the diaphragm. In various embodiments described above, the diaphragm assembly is polysilicon, but other materials may be used.

It should also be noted that the present invention is not limited to any particular type or number of springs for coupling the diaphragm to the at least one carrier. Embodiments of the present invention may use different types and numbers of springs. For example, various embodiments of the present invention may use spring types and configurations described in the related application having Ser. No. 60/885,314 which was incorporated by reference above.

It should also be noted that the present invention is not limited to any particular type of insulator between the substrate and the at least one carrier. In various embodiments described above, the insulator is an oxide, but other types of insulators may be used.

It should also be noted that the present invention is not limited to any particular type of packaging. For example, various embodiments of the present invention may use packaging techniques described in the related applications having Ser. Nos. 11/338,439, and 11/366,941, respectively, both of which were incorporated by reference above.

Although the above discussion discloses various exemplary embodiments of the invention, it should be apparent that those skilled in the art can make various modifications that will achieve some of the advantages of the invention without departing from the true scope of the invention.

What is claimed is:

1. A microphone comprising:
   a substrate comprising a conductive, integral backplate, wherein the backplate further comprises a plurality of throughholes, and wherein the backplate forms a fixed plate of a variable capacitor;
   a diaphragm assembly supported by the substrate, the diaphragm assembly including at least one carrier, a conductive diaphragm, and at least one spring coupling the diaphragm to the at least one carrier, the diaphragm being spaced from the at least one carrier; and
   at least one insulator between the substrate and the at least one carrier so as to electrically isolate the diaphragm and the substrate, wherein the diaphragm forms a movable plate of the variable capacitor.

2. A microphone according to claim 1, wherein each carrier is coupled to an insulator and wherein such insulator is coupled to the substrate.

3. A microphone according to claim 1, wherein the diaphragm is perforated.

4. A microphone according to claim 1, wherein the diaphragm is corrugated.

5. A microphone according to claim 1, wherein the diaphragm has a plane when unflexed, the at least one spring producing a space between the diaphragm and the at least one carrier in the direction of the plane of the diaphragm.

6. A microphone according to claim 1, wherein the diaphragm is stress isolated from the at least one carrier.

7. A microphone according to claim 1, wherein the at least one carrier comprises a single unitary carrier surrounding the diaphragm.

8. A microphone according to claim 1, wherein the at least one carrier comprises a plurality of distinct carriers.

9. A microphone according to claim 1, wherein the at least one insulator comprises an oxide.

10. A microphone according to claim 1, wherein the diaphragm assembly comprises polysilicon.

11. A microphone according to claim 1, wherein the at least one insulator is formed directly or indirectly on the substrate.

12. A microphone according to claim 11, wherein the at least one carrier is formed directly or indirectly on the at least one insulator.

13. A microphone according to claim 1, wherein the substrate is formed from a silicon layer of a silicon-on-insulator wafer.

14. A microphone according to claim 1, wherein the throughholes allow sound waves to reach the diaphragm from a back-side of the substrate.

15. A microphone according to claim 1, further comprising electronic circuitry that produces a signal in response to diaphragm movement.

16. A microphone according to claim 15, wherein the electronic circuitry is formed direct or indirectly on the substrate.

17. A microphone comprising:
   a substrate comprising a conductive, integral backplate, wherein the backplate further comprises a plurality of throughholes;
   a conductive diaphragm;
   support means for movably coupling the diaphragm to the substrate, the support means including carrier means for fixed coupling with the substrate and suspension means for movably coupling the diaphragm to the carrier means and spacing the diaphragm from the carrier means;
   insulator means for electrically isolating the diaphragm and the substrate; and
   means for capacitively coupling the backplate and the diaphragm to form a fixed plate and a movable plate, respectively, of a variable capacitor.

18. A microphone according to claim 17, further comprising means for allowing sound waves to reach the diaphragm from a back-side of the substrate.

19. A microphone according to claim 17, further comprising means for producing a signal in response to diaphragm movement.

* * * * *